United States Patent
Loucks et al.

(10) Patent No.: US 10,598,715 B2
(45) Date of Patent: Mar. 24, 2020

(54) SYSTEM AND METHOD FOR AUTOMATIC HIGH RESISTANCE GROUND PULSE ACTIVATION AND DETECTION

(71) Applicant: Eaton Corporation, Cleveland, OH (US)

(72) Inventors: David Glenn Loucks, Coraopolis, PA (US); Robert Thomas Wolfe, Brookfield, WI (US); Steven Andrew Dimino, Wauwatosa, WI (US); Daniel Edward Hrncir, Arden, NC (US); Deborah Kaltwasser Mort, Coraopolis, PA (US); Alec Dane Burkle, Hendersonville, NC (US)

(73) Assignee: Eaton Intelligent Power Limited, Dublin (IE)

( * ) Notice: Subject to any disclaimer, the term of this patent is extended or adjusted under 35 U.S.C. 154(b) by 1011 days.

(21) Appl. No.: 14/835,163

(22) Filed: Aug. 25, 2015

(65) Prior Publication Data

US 2017/0059641 A1    Mar. 2, 2017

(51) Int. Cl.
*G01R 31/08* (2020.01)
*H02H 3/16* (2006.01)
(Continued)

(52) U.S. Cl.
CPC ........... *G01R 31/08* (2013.01); *G01R 31/086* (2013.01); *H02H 3/162* (2013.01); *H02H 3/165* (2013.01);
(Continued)

(58) Field of Classification Search
CPC ...... G01R 31/08; G01R 31/025; H02H 3/105; H02H 3/162; H02H 3/165; H02H 3/17
See application file for complete search history.

(56) References Cited

U.S. PATENT DOCUMENTS 6,888,708 B2    5/2005  Brungs et al.
7,180,300 B2    2/2007  Premerlani et al.
(Continued)

FOREIGN PATENT DOCUMENTS

JP    7046750 A    2/1995
JP    11218555 A    8/1999
(Continued)

OTHER PUBLICATIONS

IRDH575 Series, Digital Ground Fault Monitor / Ground Detector Controller for Ground Fault Location System Ungrounded (Floating) AC/DC Systems, Technical Bulletin, Mar. 2011.*
(Continued)

*Primary Examiner* — Daniel R Miller
(74) *Attorney, Agent, or Firm* — Ziolkowski Patent Solutions Group, SC

(57) ABSTRACT

A system for locating a ground fault in an HRG power distribution system includes an HRG pulsing system having a ground fault sensor to detect a ground fault, a pulsing contactor to introduce a pulsing current into the power distribution system, and a controller to control the pulsing contactor to introduce the pulsing current into the power distribution system in response to a ground fault detection by the ground fault sensor. Current sensors in the power distribution system monitor three-phase current signals on conductors of the power distribution system, with the current sensors positioned on distribution networks in the power distribution system and at a protection device included on each respective distribution network. A processor associated with each protection device and operably connected to the current sensors thereat receives signals from the current sensors for identifying a location of a ground fault in the power distribution system.

19 Claims, 5 Drawing Sheets

(51) Int. Cl.
 *H02H 3/17* (2006.01)
 *H02J 13/00* (2006.01)
 *G01R 31/02* (2006.01)
(52) U.S. Cl.
 CPC ........... *H02H 3/17* (2013.01); *H02J 13/0013* (2013.01); *H02J 13/0024* (2013.01); *G01R 31/025* (2013.01)

(56) References Cited

U.S. PATENT DOCUMENTS

| | | | |
|---|---|---|---|
| 8,474,320 | B2 | 7/2013 | Kordon et al. |
| 8,531,804 | B2 | 9/2013 | Weems, II et al. |
| 2003/0043515 | A1 | 3/2003 | Brungs et al. |
| 2006/0125486 | A1 | 6/2006 | Premerlani et al. |
| 2011/0080676 | A1 | 4/2011 | Yoshida et al. |
| 2011/0179342 | A1* | 7/2011 | Kim .................... H04L 43/0817 714/807 |
| 2012/0112757 | A1 | 5/2012 | Vrankovic et al. |
| 2012/0249038 | A1 | 10/2012 | Wei et al. |
| 2012/0330582 | A1 | 12/2012 | Wiszniewski et al. |
| 2013/0218491 | A1 | 8/2013 | Wei et al. |
| 2013/0322133 | A1 | 12/2013 | Li |
| 2014/0049261 | A1 | 2/2014 | Flack |
| 2015/0168481 | A1 | 6/2015 | Hackl et al. |
| 2015/0346266 | A1* | 12/2015 | Dimino ................ G01R 31/025 702/59 |
| 2016/0061879 | A1* | 3/2016 | Dougherty ........... G01R 31/086 361/93.2 |

FOREIGN PATENT DOCUMENTS

| | | |
|---|---|---|
| JP | 11220830 A | 8/1999 |
| JP | 2002078190 A | 3/2002 |
| JP | 3792888 B2 | 7/2006 |
| JP | 2006234461 A | 9/2006 |
| WO | 8300562 A1 | 2/1983 |
| WO | 2015184120 A1 | 12/2015 |

OTHER PUBLICATIONS

Inoue et al., "Development of Protection System Based on Pulsed Power Switching for High-Resistance Ground Fault of Power Feeding System of DC Electric Railway," IEEE, Pulsed Power Conference, 1993, pp. 25-28.

Skibinski et al., "Part I: Application Guidelines for High Resistance Grounding of Low Voltage Common AC Bus & Common DC BUS PWM Drive Systems," IEEE, Pulp and Paper Industry Technical Conference, Jun. 2008, pp. 1-8.

Tengg et al., "Evaluation of New Earth Fault Localization Methods by Earth Fault Experiments," CIRED, 22nd International Conference on Electricity Distribution, Stockholm, Jun. 10-13, 2013, pp. 1-4.

* cited by examiner

SYSTEM AND METHOD FOR AUTOMATIC HIGH RESISTANCE GROUND PULSE ACTIVATION AND DETECTION

BACKGROUND OF THE INVENTION

The present invention relates generally to power distribution systems and, more particularly, to a system and method for automatically detecting and localizing high resistance ground faults (HRGFs) in a high resistance grounded (HRG) power distribution system, with a pulsing current utilized for localizing the HRGFs being automatically initiated and terminated.

A ground fault is an undesirable condition in an electrical system in which electrical current flows to the ground. A ground fault occurs when the electrical current in a distribution or transmission network leaks outside of its intended flow path. Distribution and transmission networks are generally protected against faults in such a way that a faulty component or transmission line is automatically disconnected with the aid of an associated circuit breaker. As one particular example, an HRG power distribution system limits fault current (typically to less than 5 amperes) in order to minimize downtime of the system, with the system remaining in service as long as only a single ground fault is present. However, with such HRG power distribution systems, it is recognized that locating the ground fault in a timely manner is required in order for downtime minimization to be realized (i.e., location of the ground fault while only a single ground fault is present).

As a means to provide for locating a ground fault in an HRG power distribution system, some recent HRG power distribution systems have been configured as HRG pulsing systems—with such systems making use of a pulsing current that is introduced into the system in order to provide for locating the ground fault. One such example of an HRG power system that utilizes test signals or pulses to trace an HRGF is set forth in U.S. Pat. No. 7,180,300 to General Electric Co., in which processors are used to calculate relationships between current and voltage phase angles present in a power distribution system, with the technique reading the current and voltage, calculating the zero sequence current (after subtracting the capacitive charging current), then running this signal through a low pass analog filter in order to determine a change in the RMS amplitude value of the zero sequence current before and after pulsing—with a faulted feeder being identified if the magnitude of the output of the filter exceeds some pre-determined value. The technique thus provides for an automated means for locating a ground fault in an HRG power distribution system, albeit with the drawbacks that the technique is very complex and computationally intensive (while at the same time, certain elements are not robust in being able to detect a fault) and that the technique requires the use of voltage sensors due to the need for extra sensitivity to differentiate between the capacitive charging current and the actual pulsing ground current, therefore adding cost to the system.

Another example of an HRG power distribution system that utilizes an HRG pulsing system to locate a ground fault is described in U.S. application Ser. No. 14/291,161, filed May 30, 2014, by Eaton Corporation and which is hereby incorporated by reference in its entirety. As described therein, and as reproduced herebelow in FIG. 1, the HRG power distribution system 10 includes a power transformer 12 having an input side 14 and an output side 16. The power transformer 12 comprises three phases, i.e., a first phase 18, a second phase 20, and a third phase 22 that are coupled, in the example of FIG. 1, per the angle of the primary and secondary windings. That is, the third phase 22 on the primary has the same angle as what is shown as the first phase 18 on the secondary. Likewise, the first phase 18 on the primary is coupled with the second phase 20 shown on the secondary, and the second phase 20 on the primary is coupled with what is shown as the third phase 22 on the secondary.

The three phases 18, 20, 22 of the power transformer 12 are coupled to a plurality of three-phase distribution networks 24, 26. A load 28, such as an induction motor, for example, is connected to each distribution network 24, 26 to receive three phase power therefrom. Each distribution network 24, 26 is also provided with a circuit breaker 30.

The HRG power distribution system 10 includes a neutral line 32 at the output side 16 of the power transformer 12 that is grounded via one or more grounding resistors 34 included in the HRG pulsing system 36. The grounding resistors 34 are configured to reduce the ground fault current, so that the HRG power distribution system 10 can remain in operation while a ground fault is being located. That is, when there is an occurrence of a ground fault in the HRG power distribution system 10, the grounding resistors 34 limit the ground fault current.

The HRG pulsing system 36 also includes a ground fault sensor 37 that senses an occurrence of a ground fault in the HRG power distribution system 10 and signals a test signal generator 38 (i.e., "pulsing circuit") that is incorporated into the HRG pulsing system 36 and is configured to introduce a test signal into the HRG power distribution system 10. The pulsing circuit 38 includes a pulsing switch or contactor 40 and associated controller 42 provided to generate a pulsing current 44 in the HRG power distribution system 10. One of the grounding resistors 34 is periodically partially shorted or, alternatively, one of the ground resistors 34 is connected in addition to the other ground resistor 34 by closing the pulsing contactor 40 (via controller 42) to generate the pulsing current 44 at desired intervals.

As further shown in FIG. 1, a ground fault locating system 48 is provided for the HRG power distribution system 10. The ground fault locating system 48 includes a plurality of current sensors 50, 52 coupled to the three-phase HRG power distribution system 10, for measuring values of the instantaneous three-phase current. The current sensors 50, 52 are positioned on respective distribution networks 24, 26 and are located on the distribution networks to measure three-phase current signals at a respective protection device 54 connected thereto. The protection devices 54 may be in the form of protection relay units included in the ground fault locating system 48. The protection relay units 54 operate as highly configurable motor, load, and line protection devices with power monitoring, diagnostics and flexible communications capabilities—including controlling contactors 56 on the distribution networks 24, 26. The current signals generated/measured by current sensors 50, 52 are provided to processors 58 that are incorporated into the protection relay units 54, with the processors 58 performing computations for identifying the presence of a ground fault indicative of an HRGF condition in the HRG power distribution system 10.

After activation of the HRG pulsing system 36 and during the time where a ground fault exists on a system, the HRG pulsing system 36 modulates (pulses) the ground current between two distinct values (e.g., between 5 and 10 amperes on a 600V class or less low voltage system). The ground fault locating system 48 is capable of detecting zero-sequence (ground) current to determine if the pulsing current 44 is present (as shown in the distribution network 24) or absent (as shown in the distribution network 26). If one of the protection relay units 54 detects the pulsing current 44, that motor protection relay unit is located somewhere between the point of the ground fault and the incoming source. With portable ground sensing equipment, isolation of the ground fault occurs when one of the sensing units 54 is positioned just downstream from the point of the ground fault, at which point the pulsing current 44 cannot be detected by the sensing units 54. This transition from detecting the pulsing current 44 to no longer detecting the pulsing current 44 is the exact location of the ground fault. In permanently mounted ground sensing equipment—where the position of the ground current cannot be moved—the location of the ground will be isolated to be somewhere between a downstream sensing unit 54 that detects no fault and upstream sensing unit 54 that does detect a fault.

However, in each of the HRG power distribution systems set forth in U.S. Pat. No. 7,180,300 and U.S. application Ser. No. 14/291,161, introduction and termination of the pulsing current 44 is presently performed via a manual controlling of the HRG pulsing system 36. While this manual introduction and termination of a pulsing current is not a limitation or drawback in HRG power distribution systems where locating the ground fault is done with a hand-held ammeter—i.e., since an operator is still needed to carry the portable current sensing device and read and interpret the pulsing signature of the current, such that manually controlling the pulse current is not an appreciable additional burden—it is recognized that the manual controlling of the pulsing current/test signal in automated HRGF detection/localization systems is less than ideal. That is, as the HRG power distribution system incorporates means for automatically detecting a pulsing zero-sequence current signature and localizing a ground fault (thus eliminating the need for manual localization), requiring an operator to manually introduce and terminate the pulsing current becomes an unnecessary step that unduly delays the process of detecting and locating a ground fault, with such manual activation of the HRG pulsing system making it impossible to localize the ground fault within an optimal timeframe after it appears.

Furthermore, it is recognized that removal/termination of the pulsing current as soon as is practical after localization of the ground fault is also highly desirable. That is, leaving the HRG pulsing system on for an extended time beyond that which is necessary in order to localize the ground fault within the HRG power distribution system increases the wear not only on the device(s) switching the current (e.g., pulsing contactor 40), but also on the insulation of the HRG power distribution system, as generation of the pulsing current results in transient voltage that can be modeled as $V=L*di/dt$ (with V being voltage, L being inductance of the series path carrying the current, and di/dt being the instantaneous rate of current change), where the dt term is small and the voltage term V is large. While existing systems rely on an operator to manually deactivate/terminate the pulsing current upon localizing of the ground fault, it is recognized that even the most skilled operators may forget that the pulsing current is active and/or may be called away from the HRG power distribution system, resulting in leaving the HRG pulsing system on for an extended time. Even when an operator acts in an appropriate fashion to terminate the pulsing current as soon as is practical, there will always be a delay between when the ground fault is localized and when the operator will be able to access the HRG pulsing system to switch off the pulsing current, and this time can vary based on operator efficiency and accessibility of the HRG pulsing system.

It would therefore be desirable to provide a system and method that provides an automated approach for introducing and terminating a pulsing current used for detecting and localizing an HRGF in a three-phase power distribution system, so as to allow for localization of a ground fault within an optimal timeframe and prevent unnecessary wear on pulsing contactors and insulation in the HRG power system. The system and method would also beneficially eliminate the need for manual introduction and termination of the pulsing current and locating of the ground fault (e.g., with a hand-held ammeter) so as to reduce safety concerns and costs associated with such manual activation, termination and detection.

BRIEF DESCRIPTION OF THE INVENTION

Embodiments of the present invention provide a system and method for automatically detecting HRGFs in a power distribution system and identifying the location of such ground faults, with a pulsing current utilized for localizing the HRGFs being automatically initiated and terminated.

In accordance with one aspect of the invention, a system for locating a ground fault in an HRG power distribution system includes an HRG pulsing system having a ground fault sensor configured to detect a ground fault, a pulsing contactor configured to introduce a pulsing current into the HRG power distribution system, and a controller configured to automatically control the pulsing contactor to introduce the pulsing current into the HRG power distribution system in response to a ground fault detection by the ground fault sensor. The HRG power distribution system also includes a plurality of current sensors adapted to monitor three-phase current signals present on conductors of the HRG power distribution system, wherein the plurality of current sensors are positioned on a number of distribution networks included in the HRG power distribution system and at a protection device included on each respective distribution network. The HRG power distribution system further includes a processor associated with each protection device and operably connected to the current sensors thereat to receive signals from the current sensors for identifying a location of a ground fault in the HRG power distribution system.

In accordance with another aspect of the invention, a method for automatically detecting and localizing a ground fault in a high resistance grounded (HRG) power distribution system includes providing a protection device on each of a number of distribution networks in the HRG power distribution system, each distribution network having a three-phase load connected thereto. The method also includes providing current sensors at each protection device, detecting a ground fault in the HRG power distribution system via an HRG pulsing system, automatically controlling the HRG pulsing system to introduce a pulsing current into the HRG power distribution system in response to the ground fault detection, and monitoring current at each protection device via the current sensors to collect three-phase current data. The method further includes inputting the current data to a processor associated with each protection device and detecting the pulsing current in the three-phase current data on a respective distribution network of the number of distribution networks via the current data input to the processor of the respective protection device, so as to localize a ground fault in the HRG power distribution to the respective distribution network.

In accordance with yet another aspect of the invention, an HRG pulsing system for automatically introducing a pulsing current into an HRG power distribution system in response to a ground fault detection is provided. The HRG pulsing system includes a ground fault sensor configured to detect a ground fault in the HRG power distribution system, a pulsing contactor selectively controllable to introduce a pulsing current into the HRG power distribution system, and a controller configured to control the pulsing contactor to introduce the pulsing current into the HRG power distribution system in response to a ground fault detection by the ground fault sensor.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to a system and method for automatically detecting and locating HRGFs in an HRG power distribution system, with a pulsing current utilized for localizing the HRGFs being automatically initiated and terminated. The system may be utilized in HRG power distribution systems encompassing a plurality of structures and control schemes, and thus application of the invention is not meant to be limited strictly to HRG power distribution systems having the specific structure described here below.

Figure 1:
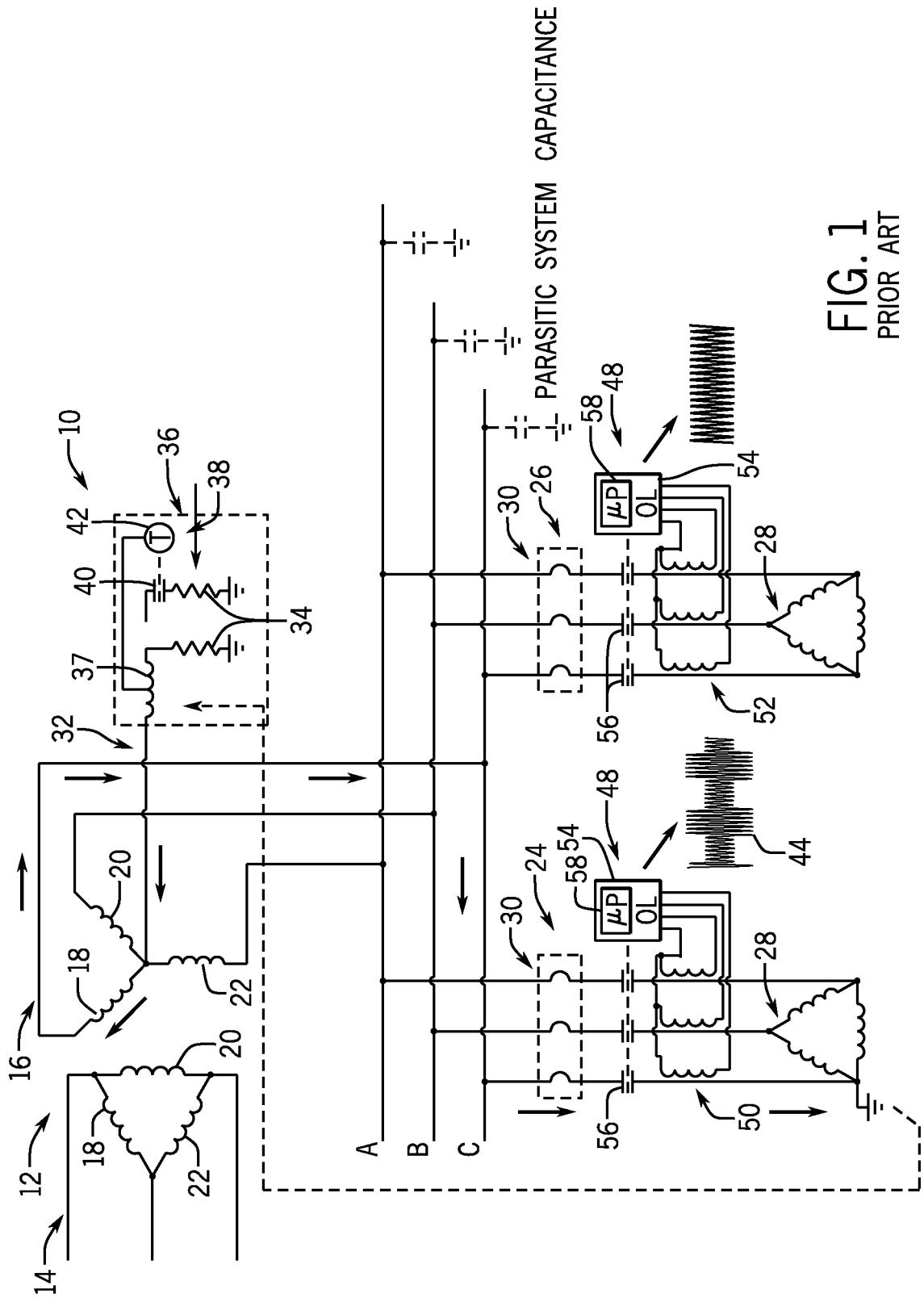
FIG. 1 is a diagrammatical view of a known system for locating a ground fault in an HRG power distribution system.
Figure 2:
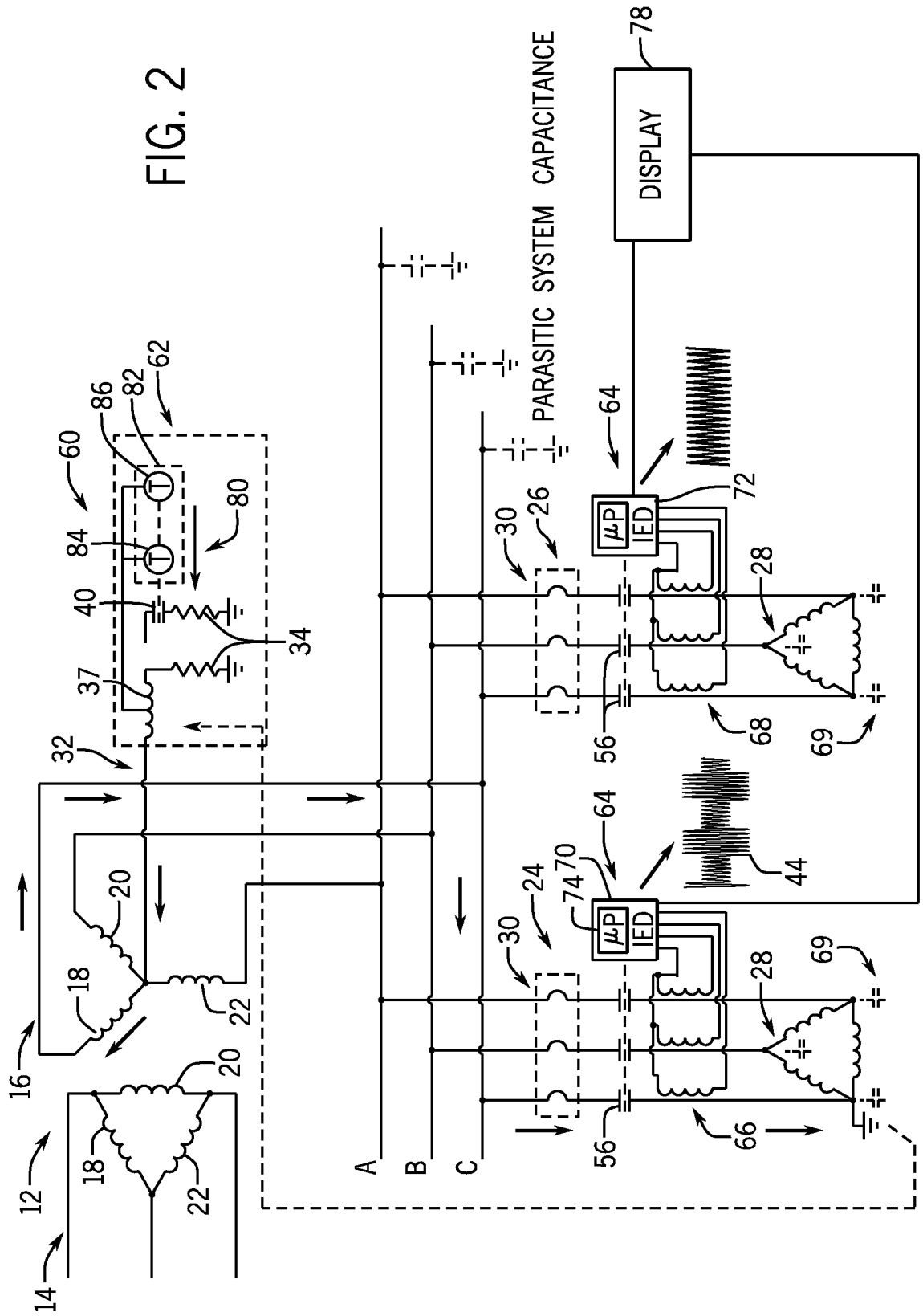
FIG. 2 is a diagrammatical view of a system for locating a ground fault in an HRG power distribution system, according to an embodiment of the invention.

Referring to FIG. 2, an HRG power distribution system 60 including an HRG pulsing system 62 is shown, according to an embodiment of the invention. The HRG power distribution system 60 includes a number of components similar to components of the HRG power distribution system 10 of FIG. 1, and thus numbers used to indicate components in FIG. 1 will also be used to indicate similar components in FIG. 2. The HRG power distribution system 60 includes the power transformer 12 of FIG. 1, with the input side 14, the output side 16, and the first, second, and third phases 18, 20, 22 coupled in the same fashion as in the HRG system 10 of FIG. 1. While the output side 16 is shown an a wye configuration, the output side 16 may also be in a delta configuration like the input side 14.

The three phases 18, 20, 22 of the power transformer 12 are coupled to the plurality of three-phase distribution networks 24, 26. While only two distribution networks 24, 26 are illustrated in FIG. 2, it is recognized that a greater number of distribution networks could included in the HRG power distribution system 60. The loads 28 are coupled to each distribution network 24, 26. Each distribution network 24, 26 is also provided with the circuit breakers 30, as well as other protective devices (not shown), where necessary.

The HRG power distribution system 60 also includes a ground fault locating system 64 that includes components on each distribution network 24, 26 for detecting the pulsing current 44 introduced into the HRG power distribution system 60 by HRG pulsing system 62, as will be described further below. Ground fault locating system 64 includes a plurality of current sensors 66, 68 coupled to the HRG phase power distribution system 60 for measuring values of the instantaneous three-phase current. In one exemplary embodiment, such as where contactors and/or control/protection devices associated with the loads 28 on power distribution networks 24, 26 are NEMA size 4, 5, or larger, the current sensors 66, 68 may be current transformers (CTs) configured to generate feedback signals representative of instantaneous current through each phase. Other types of current sensors may, of course, be employed.

The current sensors 66, 68 are positioned on respective distribution networks 24, 26 and are located on the distribution networks 24, 26 to measure three-phase current signals at protection devices 70, 72 connected thereto. According to various embodiments, the protection devices 70, 72 may be in the form of intelligent electronic devices (IED) that provide protection to the connected loads 28, such as motors, for example. According to an exemplary embodiment, the IEDs may be in the form of (digital) protective relaying devices that include a microprocessor to perform several protective, control, and similar functions. However, while specific reference is made here-after to the protection devices 70, 72 being "IEDs," it is to be understood that other protection devices—for motors or other loads—are considered to be within the scope of the invention, and can include circuit breakers, variable frequency drives, or even stand-alone metering. As shown in FIG. 2, the IEDs 70, 72 are included in the ground fault locating system 64 and operate as highly configurable motor, load, and line protection devices with power monitoring, diagnostics and flexible communications capabilities—including controlling contactors 56 on the distribution networks 24, 26.

The current signals generated/measured by current sensors 66, 68 are provided to processors 74, 76 that are incorporated into the IEDs 70, 72. While processors 74, 76 are shown and described as being incorporated into IEDs 70, 72, it is recognized that the processors 74, 76 could also be stand-alone devices/units or incorporated/form other devices, including microprocessor based modules, application-specific or general purpose computers, programmable logic controllers, or logical modules. The processors 74, 76 may provide for an analog-to-digital conversion of the signals received from the current sensors 66, 68, digitally filter the signals received from the current sensors 66, 68, and perform computations for identifying the presence of the pulsing current 44 indicative of an HRGF condition in the HRG power distribution system 60.

In operation, the processor 74, 76 of each IED 70, 72 receives signals from its associated current sensors 66, 68 regarding the measured three-phase current present on the distribution network 24, 26 to which the current sensors are attached—i.e., at the IEDs. Depending on the location of the ground fault in the power distribution system 10, the current measured by the current sensors 66, 68 may be a measure of just the normally occurring system "capacitive system charging currents" (plus any nominal additional current that may be present, i.e., a "no ground fault" nominal current) that are present downstream from the current sensors 66, 68, as shown by parasitic capacitance 69 on the loads 28 in FIG. 2, or may be a measure of the capacitive system charging currents and a ground current present on one of the distribution networks 24, 26 resulting from a ground fault located thereon. As previously mentioned above, the HRG pulsing system 62 functions to introduce a pulsing current 44 into the power distribution system 60 upon occurrence of a ground fault. This pulsing current signal is introduced periodically (e.g., frequency of 1 Hz) and serves to increase the ground fault current present in the HRG power distribution system 60—with the increase of the ground current being measurable by the current sensors 66, 68 and discernible by the processors 74, 76 when present. According to embodiments, the pulsing current signal serves to increase the ground fault by a factor of 1.5-3.0 times, with a doubling of the current being provided in an exemplary embodiment. In an exemplary embodiment, the processors 74, 76 receive measurements of the three-phase current signals from the current sensors 66, 68 over a plurality of cycles (e.g., 4 to 5 cycles) and identify a pattern of interest in the three-phase current signals across the plurality of cycles in order to detect the pulsing current—with the increase of the ground current provided by the pulsing current generating an identifiable pattern that the processors 74, 76 analyze in order to verify the presence of a ground fault, as described in detail in U.S. application Ser. No. 14/291,161 by Eaton Corporation.

In some embodiments, the processors 74, 76 are configured to indicate the presence or absence of the pulsing current 44 to a display 78. The display 78 may include any type of display useful for displaying such an indication, such as a graphical user interface or a computer monitor, as examples. The display 78 may then display the indications from the processors 74, 76 in a format readable by an operator. In displaying the indications of the presence or absence of the pulsing current 44 on the display 78, the processors 74, 76 are able to indicate in which distribution network 24, 26 the ground fault is present. In the case of FIG. 2, the processor 74 would indicate the presence of the pulsing current 44 in the distribution network 24 to the display 78, and the processor 76 would indicate the absence of the pulsing current 44 in the distribution network 26 to the display 78. Thus, an operator would be alerted to the location of the ground fault in the distribution network 24.

As shown in FIG. 2, neutral line 32 at the output side 16 of the power transformer 12 is grounded via one or more grounding resistors 34 included in the HRG pulsing system 62. When the output side 16 is in a delta configuration, neutral line 32 is a derived neutral line, which is derived using either a wye/delta or a wye/broken-delta transformer, as is known in the art. While the grounding resistors 34 are shown coupled in parallel in FIG. 2, in some embodiments, the grounding resistors 34 are coupled in series. The grounding resistors 34 are configured to reduce the ground fault current so that the HRG power distribution system 60 can remain in operation while a ground fault is being located. That is, when a ground fault is present in the HRG power distribution system 60, the grounding resistors 34 limit the ground fault current.

The HRG pulsing system 62 includes a ground fault sensor 37 that senses an occurrence of a ground fault in the HRG power distribution system 60 according to a known technique. The ground fault sensor 37 may be any type of sensor suitable for detecting a ground fault, such as an overcurrent sensor or an overvoltage sensor, for example. The ground fault sensor 37 is connected with a test signal generator 80 (i.e., "pulsing circuit") incorporated into the HRG pulsing system 62 that is configured to introduce a test signal into the HRG power distribution system 60. In a typical embodiment, the test signal is in the form of pulsing current 44 and is generated at desired intervals at a frequency of 0.5 Hz to 10 Hz, for example. In the embodiment illustrated in FIG. 2, the pulsing circuit 80 includes the pulsing switch or contactor 40 and an associated controller 82 configured to control operation of the contactor 40 in order to generate the pulsing current 44 in the HRG power distribution system 60. In generating the pulsing current 44, one of the grounding resistors 34 is periodically partially shorted by controlling (i.e., opening and closing) the pulsing contactor 40 (via controller 82) to generate the pulsing current 44 at desired intervals.

As shown in FIG. 2, according to one embodiment of the invention, the controller 82 includes a pulsing timer 84 for controlling the pulsing contactor 40. The pulsing timer 84 is coupled to the ground fault sensor 37 so that the ground fault sensor 37 may send a ground fault detection signal to the pulsing timer 84 that indicates a ground fault has been detected. When the ground fault sensor 37 sends the ground fault detection signal to the pulsing timer 84, the pulsing timer 84 is energized and introduces the pulsing current 44 into the HRG power distribution system 60 by controlling operation of the pulsing contactor 40. In this manner, the pulsing timer 84 is configured to automatically introduce the pulsing current 44 into the HRG power distribution system 60 in response to a ground fault detection by the ground fault sensor 37.

The controller 82 also includes a reset timer 86 that is configured to automatically de-energize the pulsing timer 84 after a predetermined amount of time. The reset timer 86 is coupled to the ground fault sensor 37 so that when the ground fault sensor 37 detects a ground fault, the ground fault sensor 37 sends the ground fault detection signal to the reset timer 86. Once the reset timer 86 receives the ground fault detection signal from the ground fault sensor 37, the reset timer 86 is energized to begin monitoring how much time has passed since the reset timer 86 received the ground fault detection signal. After the predetermined amount of time, the reset timer 86 de-energizes the pulsing timer 84 (and is de-energized itself), such that the pulsing contactor 40 is controlled in order that the pulsing current provided by pulsing circuit 80 is terminated. The predetermined amount of time is selected so that the processors 74, 76 of the IEDs 70, 72 of the ground fault locating system 64 have enough time to detect the pulsing current 44 and identify the location of the ground fault—i.e., the processors 74, 76 receive three-phase current measurements over a sufficient number of cycles, such as 4 to 5 cycles for example. Thus, in some embodiments, the predetermined amount of time may be approximately 10 seconds, for example.

Because the reset timer 86 is included in the controller 82 of the HRG pulsing system 62, no communications are required between the HRG pulsing system 62 and the ground fault locating system 64 to indicate that the pulsing timer 84 may be de-energized. Since communications between the ground fault locating system 64 and HRG pulsing system 62 need not be included in the HRG power distribution system 60, the costs associated with manufacturing and installing the HRG power distribution system 60 are reduced. However, because HRG power distribution system conditions change over time, extra pulsing time may need to be added above the minimum amount of time. Therefore, while manufacturing costs are reduced, the pulsing contactor 40 may be exposed to additional wear and tear because of the extra pulsing time that may not be necessary for ground fault localization.

Figure 3:
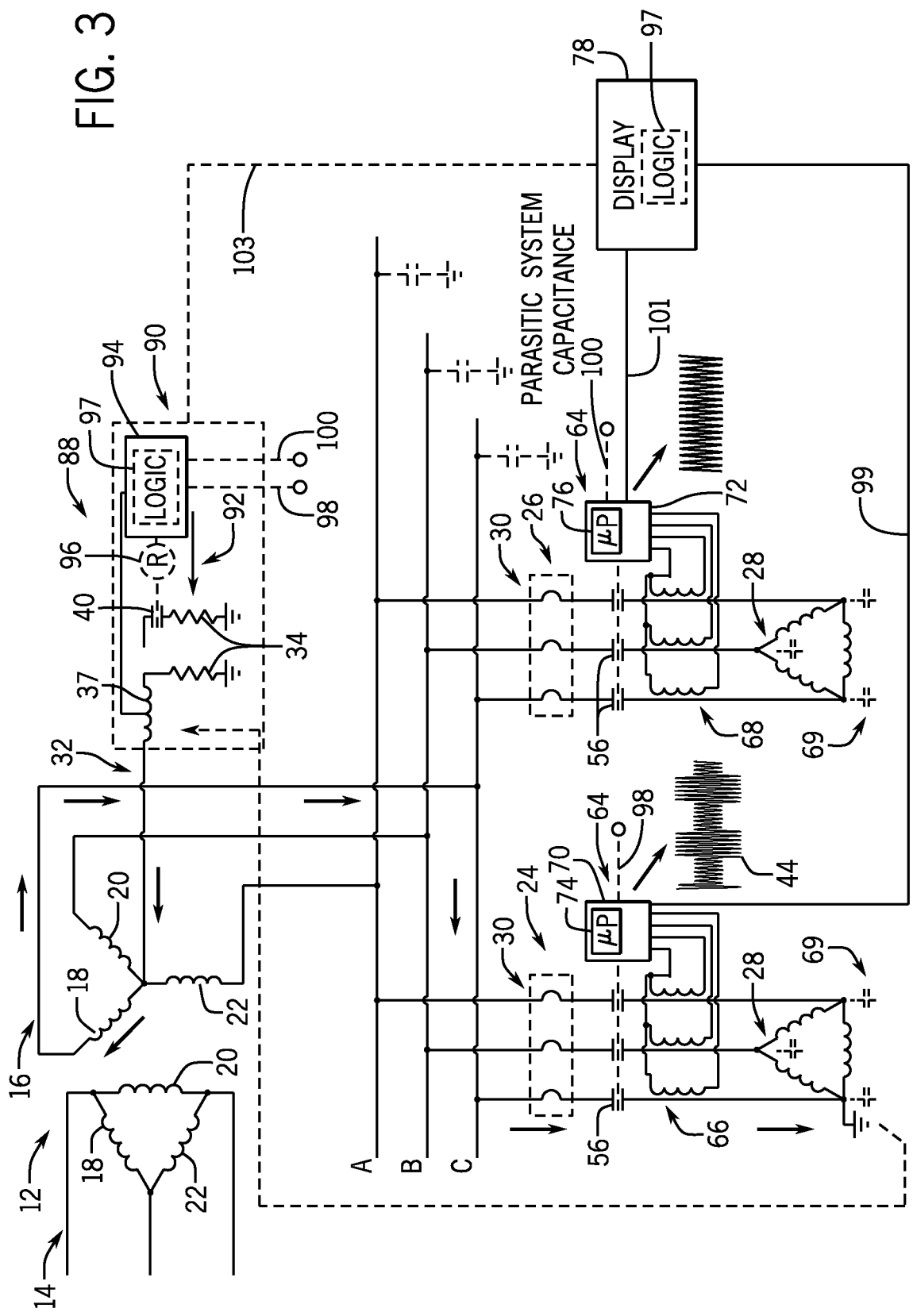
FIG. 3 is a diagrammatical view of a system for locating a ground fault in an HRG power distribution system, according to an embodiment of the invention.

Referring now to FIG. 3, an HRG power distribution system 88 including an HRG pulsing system 90 is shown, according to another embodiment of the invention. The HRG power distribution system 88 includes a number of components similar to components of the HRG power distribution system 10 of FIG. 1 and the HRG power distribution system 60 of FIG. 2, and thus numbers used to indicate components in FIGS. 1 and 2 will also be used to indicate similar components in FIG. 3. However, the HRG pulsing system 90 of HRG power distribution system 88 differs in structure and operation from the HRG pulsing system 62 of FIG. 2.

As shown in FIG. 3, according to one embodiment of the invention, the HRG pulsing system 90 includes a test signal generator 92 (i.e., "pulsing circuit") that is incorporated into the HRG pulsing system 90 and is configured to introduce a test signal into the HRG power distribution system 88. The test signal is the pulsing current 44 and is generated at desired intervals at a frequency of 0.5 Hz to 10 Hz, for example. In the embodiment illustrated in FIG. 3, the pulsing circuit 92 includes the pulsing switch or contactor 40 and an associated controller 94 provided to generate the pulsing current 44 in the HRG power distribution system 88. One of the grounding resistors 34 of the HRG pulsing system 90 is periodically partially shorted or, alternatively, one of the grounding resistors 34 is connected in addition to the other grounding resistor 34 by controlling (i.e., opening and closing) the pulsing contactor 40 (via controller 94) to generate the pulsing current 44 at desired intervals. The controller 94 may optionally control the pulsing contactor 40 through an interposing contactor 96. The interposing contactor 96 may be necessary if the pulsing contactor 40 requires voltages and/or currents that cannot be accommodated by the controller 94.

A logic circuit 97 is included in HRG power distribution system 88 that provides for selective control of the HRG pulsing system 90 and the IEDs 70, 72. While specific reference is made here-after to a "logic circuit," it is to be understood that other types of controllers are considered to be within the scope of the invention. The logic circuit 97 may be in the form of a central logic circuit with all of the components of the logic circuit 97 being centralized or in the form of a distributed logic circuit with some of the components of the logic circuit 97 being remote from other components. For example, the logic circuit 97 may include a remote input/output circuit (not shown). According to embodiments of the invention, and as shown in phantom in FIG. 3, the logic circuit 97 may be integrated in display 78 as part of a "master intelligent dashboard" for controlling the HRG power distribution system 88 via communication line 103 or may be part of a separate controller (not shown) or as part of controller 94 of the HRG pulsing system 90. Alternatively, the logic circuit 97 may be a remote input/output circuit controlled by one or more of the IEDs 70, 72.

The logic circuit 97 is in communication with the ground fault sensor 37 of the HRG pulsing system 90 so that the ground fault sensor 37 may send a ground fault detection signal to the logic circuit 97 that indicates a ground fault has been detected. When the ground fault sensor 37 sends the ground fault detection signal to the logic circuit 97, the logic circuit 97 causes controller 94 to control the pulsing contactor 40 (i.e., opening/closing the contactor 40) to introduce the pulsing current 44 into the HRG power distribution system 88 at a desired frequency. In this manner, the logic circuit 97 is configured to automatically cause the pulsing current 44 to be introduced into the HRG power distribution system 88 in response to a ground fault detection by the ground fault sensor 37.

In the embodiment illustrated in FIG. 3, the logic circuit 97 is in communication with the protection devices 70, 72 (i.e., IEDs 70, 72, such as protective relaying devices, for example). The logic circuit 97 communicates with the IEDs 70, 72 via any type of appropriate wired or wireless communication lines—such as communication lines 98, 99, 100, 101. In some embodiments, the pulsing current detection logic stored in or programmed on the processors 74, 76 of the IEDs 70, 72 for detecting the pulsing current is active at all times the HRG power distribution system 88 is active. However, in the embodiment illustrated in FIG. 3, the pulsing current detection logic of the processors 74, 76 is deactivated until the logic circuit 97 transmits an activation signal to the IEDs 70, 72. More specifically, the logic circuit 97 transmits an activation signal to the IEDs 70, 72 upon introduction of the pulsing current 44 into the HRG power distribution system 88, with the pulsing current detection logic of the processors 74, 76 of each respective IED 70, 72 being activated upon receiving the activation signal from the logic circuit 97. In this manner, the pulsing current detection logic of the processors 74, 76 is controlled to only be active when the pulsing current 44 is introduced into the HRG power distribution system 88 so that the IEDs 70, 72 are active for a minimal amount of time and power in the HRG power distribution system 88 is not wasted. Additionally, by operating the processors 74, 76 to only monitor for the pulsing current generated by the HRG pulsing system 90 when the pulsing current is introduced into the HRG power distribution system 88, the computational power requirements of the processors 74, 76 may be reduced, such that lower cost processors may be implemented in the IEDs 70, 72. Therefore, at the same time the logic circuit 97 instructs HRG pulsing system 90 to begin introducing the pulsing current 44 into the HRG power distribution system 88, the logic circuit 97 also activates the pulsing current detection logic of the processors 74, 76 by sending an activation signal to the IEDs 70, 72 via communications lines 98, 100.

When any of the processors 74, 76 of the IEDs 70, 72 detect the pulsing current, the processor 74, 76 that detects the pulsing current 44 sends a pulsing current detection signal (i.e., feedback) to the logic circuit 97 via the associated communication lines 98, 99, 100, 101. In the case of FIG. 3, the processor 74 of IED 70 sends the pulsing current detection signal to the logic circuit 97. Once the logic circuit 97 receives the pulsing current detection signal from the IED 70, the logic circuit 97 acts to cause controller 94 to control the pulsing contactor 40 so as to terminate the pulsing current 44 (i.e., to stop introducing the pulsing current 44). Additionally, according to one embodiment, the logic circuit 97 sends a deactivation signal to the IEDs 70, 72 via communication lines 98, 99, 100, 101 to deactivate the pulsing current detection logic of the processors 74, 76, such that the processors 74, 76 in the IEDs 70, 72 (or associated therewith) stop processing current data for purposes of detecting a ground fault.

Because the logic circuit 97 is in communication with the IEDs 70, 72 to receive the pulsing current detection signal, the logic circuit 97 is able to control the pulsing contactor 40 (via controller 94) to introduce the pulsing current 44 in an optimal fashion—i.e., there is always enough time to detect the ground fault, but never too much time. That is, the logic circuit 97 controls the pulsing contact 40 to introduce the pulsing current 44 for a minimal or optimal amount of time necessary to locate the ground fault, while controlling the pulsing contact 40 to terminate the pulsing current 44 immediately upon localizing the ground fault to a particular location. Controlling of the pulsing contactor 40 in this fashion (via the logic circuit 97) serves to limit/reduce transient overvoltages in the HRG power distribution system 88 and reduce wear and tear on the pulsing contactor 40, as it is recognized that the switching of the pulsing contactor 40 between an open position and a closed position at a high frequency (e.g., as much as 10 Hz, for example) causes contactor operation counts to increase quickly.

Figure 4:
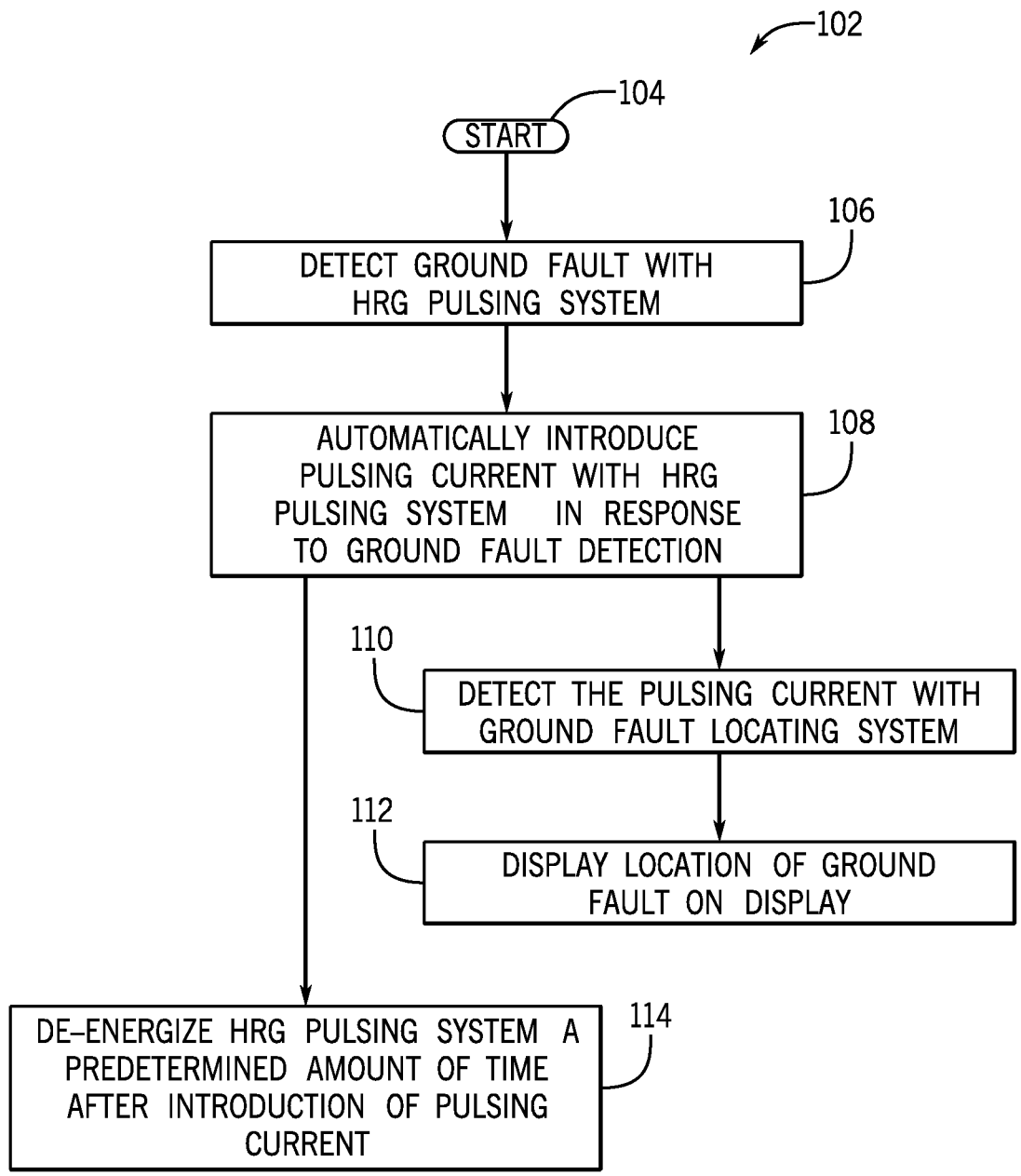
FIG. 4 is a flowchart illustrating a technique for detecting and localizing a ground fault in the HRG power distribution system of FIG. 2 according to an embodiment of the invention.

Referring to FIG. 4, and with reference back to FIG. 2, a method 102 for detecting and localizing a ground fault in the HRG power distribution system 60 is shown, with the method 102 being performed by an HRG pulsing system and a ground fault detection system in or associated with the HRG power distribution system 60, such as HRG pulsing system 62 and ground fault detection system 64 of HRG power distribution system 60, according to an exemplary embodiment. The method 102 begins at STEP 104 when power is input into the HRG power distribution system 60. At STEP 106 a ground fault is detected by the ground fault sensor 37 of HRG pulsing system 62. At STEP 108, in response to a ground fault detection signal received from the ground fault sensor 37, the pulsing current 44 is introduced into the HRG power distribution system 60 by pulsing timer 84 of the controller 82 controlling the pulsing contactor 40. At STEP 110, the IED 70 of the ground fault locating system 64 detects the pulsing current 44 in the distribution network 24 of the HRG power distribution system 60, with the processor 74 of the IED 70 analyzing measurements of three-phase current signals received thereby (from current sensors 66) over a plurality of cycles to identify a pattern of interest in the three-phase current signals in order to detect the pulsing current. At STEP 112, the IED 70 outputs the pulsing current detection signal to the display 78 to display that the ground fault is located in the distribution network 24.

Concurrently with the method proceeding with STEPS 110 and 112, the reset timer 86 of the controller 82 of the HRG pulsing system 62 de-energizes the pulsing timer 84 at STEP 114 to stop the pulsing timer 84 from controlling the pulsing contactor 40 to introduce the pulsing current 44. As set forth above, the reset timer 86 is configured to automatically de-energize the pulsing timer 84 after a pre-determined amount of time—with this pre-determined amount of time being selected so that the processor 74 of the IED 70 has sufficient time to detect the pulsing current 44 and identify the location of the ground fault.

Figure 5:
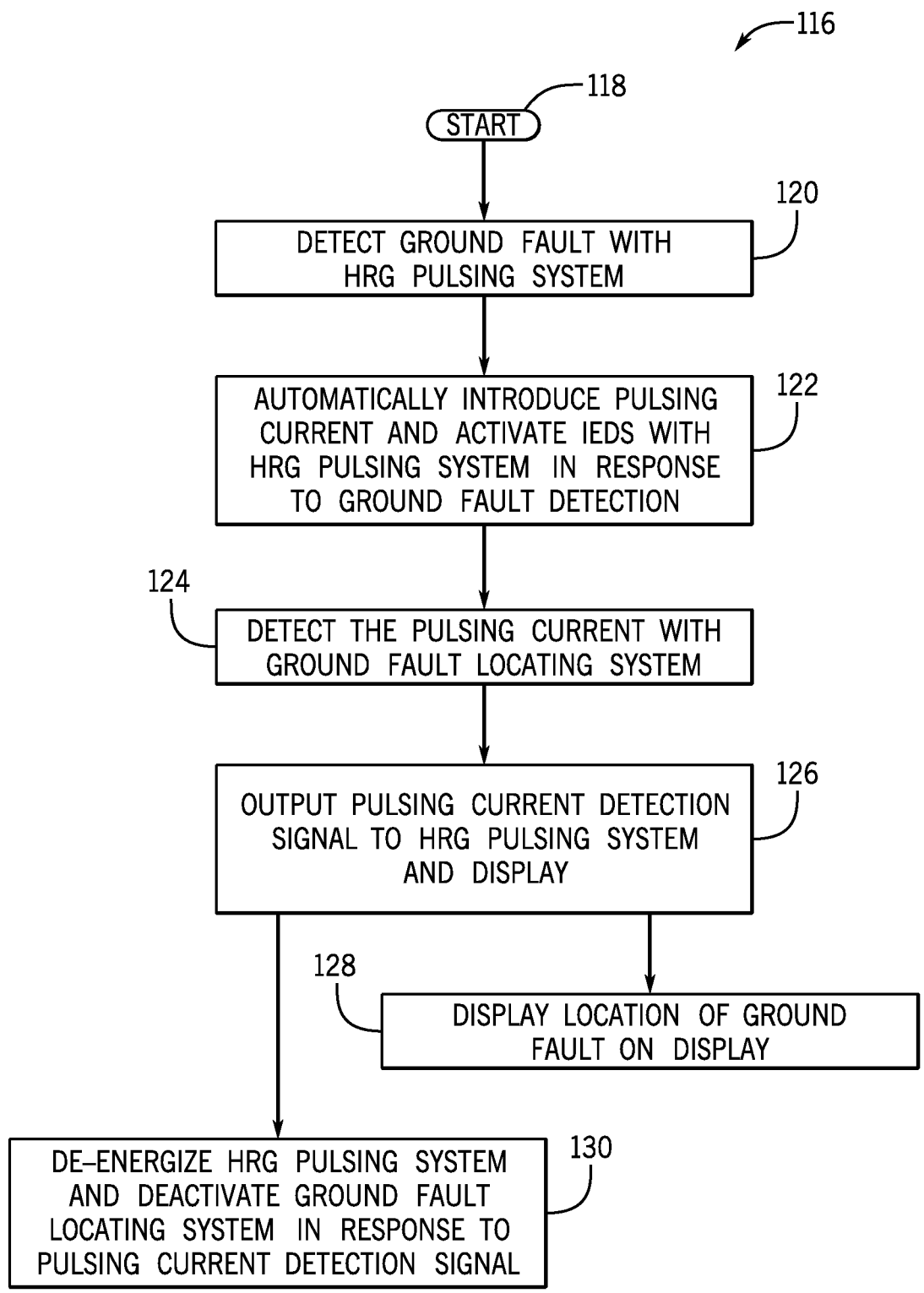
FIG. 5 is a flowchart illustrating a technique for detecting and localizing a ground fault in the HRG power distribution system of FIG. 3, according to an embodiment of the invention.

Referring now to FIG. 5, and with reference back to FIG. 3, a method 116 for detecting and localizing a ground fault in the HRG power distribution system 88 is shown, with the method 116 being performed by an HRG pulsing system and a ground fault detection system in or associated with the HRG power distribution system 88, such as HRG pulsing system 90 and ground fault detection system 64 of HRG power distribution system 88, according to an exemplary embodiment. The method 116 begins at STEP 118 when power is input into the HRG power distribution system 88. At STEP 120 a ground fault is detected by the ground fault sensor 37 of HRG pulsing system 88. At STEP 122, in response to a ground fault detection signal received from the ground fault sensor 37, the pulsing current 44 is introduced into the HRG power distribution system 88 by logic circuit 97 of the HRG pulsing system 88 controlling the pulsing contactor 40 (via controller 94). Also at STEP 122, in response to a ground fault detection signal received from the ground fault sensor 37, the logic circuit 97 activates the pulsing current detection logic of the processors 74, 76 of the ground fault locating system 64, such that the processors 74, 76 can begin monitoring and analyzing current data to detect the pulsing current. At STEP 124, the IED 70 of the ground fault locating system 64 detects the pulsing current 44 in the distribution network 24 of the HRG power distribution system 88, with the processor 74 of the IED 70 analyzing measurements of three-phase current signals received thereby (from current sensors 66) over a plurality of cycles to identify a pattern of interest in the three-phase current signals in order to detect the pulsing current and provide for localization of the ground fault.

At STEP 126, upon localization of the ground fault via detection of the pulsing current 44, the IED 70 outputs a pulsing current detection signal to the display 78 to display that the ground fault is located in the distribution network 24, with the display 78 then generating an image indicating that the ground fault is located in the distribution network 24 at STEP 128. At STEP 126, upon localization of the ground fault via detection of the pulsing current 44, the IED 70 also outputs a pulsing current detection signal that is provided as feedback to the logic circuit 97. Responsive to receiving the pulsing current detection signal from the IED 70, the logic circuit 97 de-energizes itself (i.e., stops controlling the pulsing contactor 40 to introduce the pulsing current 44) and also deactivates the pulsing current detection logic of the processors 74, 76 at STEP 130, with the termination of the pulsing current 44 serving to limit/reduce transient overvoltages in the HRG power distribution system 88 and wear and tear on the pulsing contactor 40.

Beneficially, embodiments of the invention thus provide a system and method of automatic ground fault detection and localization in HRG power distribution systems having multiple distribution networks with associated loads, with the HRG pulsing system that is utilized therein being controlled to automatically introduce and terminate pulsing current into the distribution system. The HRG pulsing system automatically energizes to introduce a pulsing current into the HRG power distribution systems in response to a ground fault detection, and de-energizes after the ground fault has been located—either via a timer-based termination or a logic based feedback loop. Embodiments of the invention relieve the need to manually energize an HRG pulsing system, manually locate a ground fault, and manually de-energize the HRG pulsing system, in contrast to existing HRG pulsing systems that require an operator to energize/de-energize the HRG pulsing system manually. In one embodiment, manufacturing and installation costs are reduced because communication between the HRG pulsing system and the ground fault locating system is not necessary. In another embodiment, communication between the HRG pulsing system and the ground fault locating system is used to operate the HRG pulsing system and ground fault locating system for an optimal amount of time, thus reducing wear and tear on the systems and operating costs of the systems and increasing system reliability.

According to one embodiment of the present invention, a system for locating a ground fault in an HRG power distribution system includes an HRG pulsing system having a ground fault sensor configured to detect a ground fault, a pulsing contactor configured to introduce a pulsing current into the HRG power distribution system, and a controller configured to automatically control the pulsing contactor to introduce the pulsing current into the HRG power distribution system in response to a ground fault detection by the ground fault sensor. The HRG power distribution system also includes a plurality of current sensors adapted to monitor three-phase current signals present on conductors of the HRG power distribution system, wherein the plurality of current sensors are positioned on a number of distribution networks included in the HRG power distribution system and at a protection device included on each respective distribution network. The HRG power distribution system further includes a processor associated with each protection device and operably connected to the current sensors thereat to receive signals from the current sensors for identifying a location of a ground fault in the HRG power distribution system.

According to another embodiment of the present invention, a method for automatically detecting and localizing a ground fault in a high resistance grounded (HRG) power distribution system includes providing a protection device on each of a number of distribution networks in the HRG power distribution system, each distribution network having a three-phase load connected thereto. The method also includes providing current sensors at each protection device, detecting a ground fault in the HRG power distribution system via an HRG pulsing system, automatically controlling the HRG pulsing system to introduce a pulsing current into the HRG power distribution system in response to the ground fault detection, and monitoring current at each protection device via the current sensors to collect three-phase current data. The method further includes inputting the current data to a processor associated with each protection device and detecting the pulsing current in the three-phase current data on a respective distribution network of the number of distribution networks via the current data input to the processor of the respective protection device, so as to localize a ground fault in the HRG power distribution to the respective distribution network.

According to yet another embodiment of the present invention, an HRG pulsing system for automatically introducing a pulsing current into an HRG power distribution system in response to a ground fault detection is provided. The HRG pulsing system includes a ground fault sensor configured to detect a ground fault in the HRG power distribution system, a pulsing contactor selectively controllable to introduce a pulsing current into the HRG power distribution system, and a controller configured to control the pulsing contactor to introduce the pulsing current into the HRG power distribution system in response to a ground fault detection by the ground fault sensor.

The present invention has been described in terms of the preferred embodiment, and it is recognized that equivalents, alternatives, and modifications, aside from those expressly stated, are possible and within the scope of the appending claims.

What is claimed is:

1. A system for locating a ground fault in a high resistance grounded (HRG) power distribution system, the system comprising:
an HRG pulsing system comprising:
a ground fault sensor configured to detect a ground fault;
a pulsing contactor configured to introduce a pulsing current into the HRG power distribution system; and
a controller configured to automatically control the pulsing contactor to introduce the pulsing current into the HRG power distribution system in response to a ground fault detection by the ground fault sensor;
a plurality of current sensors adapted to monitor three-phase current signals present on conductors of the HRG power distribution system, wherein the plurality of current sensors are positioned on a number of distribution networks included in the HRG power distribution system and at a protection device included on each respective distribution network;
a processor associated with each protection device and operably connected to the current sensors thereat to receive signals from the current sensors for identifying a location of a ground fault in the HRG power distribution system; and
a logic circuit in operable communication with the processor of each protection device, the logic circuit configured to:
control the pulsing contactor to introduce the pulsing current into the HRG power distribution system in response to a ground fault detection by the ground fault sensor; and
control the pulsing contactor to terminate the pulsing current in response to a pulsing current detection signal received from a processor of a respective protection device, the pulsing current detection signal indicating that the location of the ground fault in the HRG power distribution system has been identified.

2. The system of claim 1 wherein the controller of the HRG pulsing system comprises:
a pulsing timer configured to control the pulsing contactor to introduce the pulsing current into the HRG power distribution system in response to a ground fault detection by the ground fault sensor; and
a reset timer configured to de-energize the pulsing timer a predetermined time after the pulsing timer controls the pulsing contactor to introduce the pulsing current into the HRG power distribution system.

3. The system of claim 1 wherein the logic circuit comprises a central logic circuit with a centralized input/output circuit configured to communicate with each processor of each protection device.

4. The system of claim 1 wherein the logic circuit is a distributed logic circuit with a remote input/output circuit for communicating with each processor of each protection device.

5. The system of claim 1 wherein the logic circuit is configured to control the pulsing contactor via an interposing contactor.

6. The system of claim 1 wherein the controller of the HRG pulsing system is configured to transmit an activation signal to the protection devices upon introduction of the pulsing current into the HRG power distribution system.

7. The system of claim 6 wherein pulsing current detection logic of the processor of each respective protection device is activated upon receiving the activation signal from the controller indicating that the pulsing current has been introduced into the HRG power distribution system, with the processor monitoring for the pulsing current generated by the HRG pulsing system when the pulsing current detection logic is activated.

8. The system of claim 1 wherein the ground fault sensor comprises one of an overvoltage relay and an overcurrent relay.

9. The system of claim 1 further comprising a display configured to display a location of a ground fault in response to a ground fault detection by a processor of a protection device of a distribution network of the number of distribution networks.

10. A method for automatically detecting and localizing a ground fault in a high resistance grounded (HRG) power distribution system, the method comprising:
providing a protection device on each of a number of distribution networks in the HRG power distribution system, each distribution network having a three-phase load connected thereto;
providing current sensors at each protection device;
detecting a ground fault in the HRG power distribution system via an HRG pulsing system;
automatically controlling the HRG pulsing system to introduce a pulsing current into the HRG power distribution system in response to the ground fault detection;
monitoring current at each protection device via the current sensors to collect three-phase current data;
inputting the current data to a processor associated with each protection device;
detecting the pulsing current in the three-phase current data on a respective distribution network of the number of distribution networks via the current data input to the processor of the respective protection device, so as to localize a ground fault in the HRG power distribution to the respective distribution network; and
causing a logic circuit of the HRG power distribution system to:
receive feedback from the processor of a respective protection device indicating detection of the pulsing current thereby; and
de-energize the HRG pulsing system in response to the feedback from the processor indicating the detection of the pulsing current.

11. The method of claim 10 further comprising causing a pulsing timer and reset timer of the HRG pulsing system to de-energize the HRG pulsing system a predetermined time after the HRG pulsing system begins introducing the pulsing current into the HRG power distribution system, so as to terminate the pulsing current.

12. The method of claim 10 further comprising:
causing the logic circuit of the HRG power distribution system to transmit a signal to the protection devices upon introduction of the pulsing current into the HRG power distribution system; and
activating pulsing current detection logic of the processors of the protection devices upon receiving the signal from the logic circuit, with the processor of each respective protection device functioning to process the current data to detect the pulsing current when activated.

13. The method of claim 10 further comprising indicating on a display the distribution network in which the pulsing current was detected.

14. A high resistance grounded (HRG) pulsing system for automatically introducing a pulsing current into an HRG power distribution system in response to a ground fault detection, the HRG pulsing system comprising:
a ground fault sensor configured to detect a ground fault in the HRG power distribution system;
a pulsing contactor selectively controllable to introduce a pulsing current into the HRG power distribution system; and
a controller configured to control the pulsing contactor to introduce the pulsing current into the HRG power distribution system in response to a ground fault detection by the ground fault sensor;
wherein the controller comprises a logic circuit configured to:
control the pulsing contactor to introduce the pulsing current into the HRG power distribution system in response to a ground fault detection by the ground fault sensor; and
control the pulsing contactor to stop introducing the pulsing current in response to a pulsing current detection signal received from a processor of a protection device of a distribution network of the number of distribution networks.

15. The HRG pulsing system of claim 14 wherein the controller comprises:
a pulsing timer configured to automatically begin controlling the pulsing contactor to introduce the pulsing current into the HRG power distribution system in response to a ground fault detection by the ground fault sensor; and
a reset timer configured to de-energize the pulsing timer a predetermined time after the pulsing timer begins controlling the pulsing contactor to introduce the pulsing current into the HRG power distribution system.

16. The HRG pulsing system of claim 14 wherein the logic circuit comprises one of a central logic circuit with a centralized input/output circuit and a distributed logic circuit with a remote input/output circuit.

17. The HRG pulsing system of claim 14 wherein the logic circuit controls the pulsing contactor via an interposing contactor.

18. A system for locating a ground fault in a high resistance grounded (HRG) power distribution system, the system comprising:
an HRG pulsing system comprising:
a ground fault sensor configured to detect a ground fault;
a pulsing contactor configured to introduce a pulsing current into the HRG power distribution system; and
a controller configured to automatically control the pulsing contactor to introduce the pulsing current into the HRG power distribution system in response to a ground fault detection by the ground fault sensor;
a plurality of current sensors adapted to monitor three-phase current signals present on conductors of the HRG power distribution system, wherein the plurality of current sensors are positioned on a number of distribution networks included in the HRG power distribution system and at a protection device included on each respective distribution network; and
a processor associated with each protection device and operably connected to the current sensors thereat to receive signals from the current sensors for identifying a location of a ground fault in the HRG power distribution system;
wherein the controller of the HRG pulsing system is configured to transmit an activation signal to the protection devices upon introduction of the pulsing current into the HRG power distribution system.

19. The system of claim 18 wherein pulsing current detection logic of the processor of each respective protection device is activated upon receiving the activation signal from the controller indicating that the pulsing current has been introduced into the HRG power distribution system, with the processor monitoring for the pulsing current generated by the HRG pulsing system when the pulsing current detection logic is activated.

* * * * *